United States Patent [19]

Burrows

[11] Patent Number: 5,056,014

[45] Date of Patent: Oct. 8, 1991

[54] NETWORK SIMULATION SYSTEM

[75] Inventor: James L. Burrows, Merrimack, N.H.

[73] Assignee: Lockheed Sanders, Inc., Nashua, N.H.

[21] Appl. No.: 96,172

[22] Filed: Sep. 11, 1987

Related U.S. Application Data

[63] Continuation-in-part of Ser. No. 698,514, Feb. 4, 1985, abandoned.

[51] Int. Cl.$^5$ .................. G06F 12/00; G06F 9/455; G06F 15/00
[52] U.S. Cl. .................. 364/200; 364/228.1; 364/228.2; 364/228.3; 364/228.7; 364/228.9; 364/229; 364/229.4; 364/230; 364/230.3; 364/231.9; 364/232.3
[58] Field of Search ... 364/200 MS File, 900 MS File

[56] References Cited

U.S. PATENT DOCUMENTS

| | | | |
|---|---|---|---|
| 4,075,689 | 2/1978 | Berkling | 364/200 |
| 4,084,235 | 4/1978 | Hirtle et al. | 364/200 |
| 4,342,093 | 7/1982 | Miyoshi | 364/200 |
| 4,379,328 | 4/1983 | Catiller et al. | 364/200 |
| 4,396,980 | 8/1983 | Hingarh | 364/200 |
| 4,405,980 | 9/1983 | Hess | 364/200 |
| 4,484,266 | 11/1984 | Becker et al. | 364/200 |
| 4,494,191 | 1/1985 | Itoh | 364/200 |
| 4,513,374 | 4/1985 | Hooks, Jr. | 364/200 |
| 4,527,249 | 7/1985 | Van Brunt | 364/200 |
| 4,583,169 | 4/1986 | Cooledge | 364/200 |
| 4,590,551 | 5/1986 | Mathews | 364/200 |
| 4,694,411 | 9/1987 | Burrows | 364/578 |
| 4,725,975 | 2/1988 | Sasaki | 364/900 |
| 4,835,733 | 5/1989 | Powell | 364/900 |

OTHER PUBLICATIONS

"Type SN74LS362 (TIM9904) Four-Phase Clock Generator/Driver", *The TTL Data Book for Design Engineers*, 2nd ed. (Texas Instruments, 1976), pp. 7-460 through 7-466.
"Type SN74LS362 (TIM9904) Four-Phase Clock Generator/Driver", *The Bipolar Microcomputer Components Data Book for Design Engineers*, 2nd ed. (Texas Instruments, 1979), pp. 6-27 through 6-33.
"Am2925 Clock Generator and Microcycle Length Controller", *Advanced Micro Devices Bipolar Microprocessor Logic and Interface Data Book* (Advanced Micro Devices, Sunnyvale, 1985), pp. 5-220 through 5-235.
"Am2925 Clock Generator and Microcycle Length Controller", *Advanced Micro Devices Bipolar Microprocessor Logic and Interface Data Book* (Advanced Micro Devices, Sunnyvale, 1983), pp. 5-238 through 5-251.
"Am2925 System Clock Generator and Driver: Advanced Information", *Advanced Micro Devices The Am2900 Family Data Book With Related Support Circuits* (Advanced Micro Devices, Sunnyvale, 1978), pp. 2-183.

*Primary Examiner*—Thomas C. Lee
*Assistant Examiner*—Robert B. Harrell
*Attorney, Agent, or Firm*—David W. Gomes; Richard A. Jordan

[57] ABSTRACT

A data processing system, for processing programs in the form of networks of connected processing elements each relating to an arithmetic or logical operation, includes a memory for storing code representations of the processing elements and process data, processing apparatus including address computation circuitry for generating addresses for the memory and arithmetic and logic circuitry for processing the process data. A finite state machine receives the code representations of the processing elements and generates control signals for controlling the address computation circuitry, arithmetic and logic circuitry and memory in response to the nature of the processing element.

4 Claims, 12 Drawing Sheets

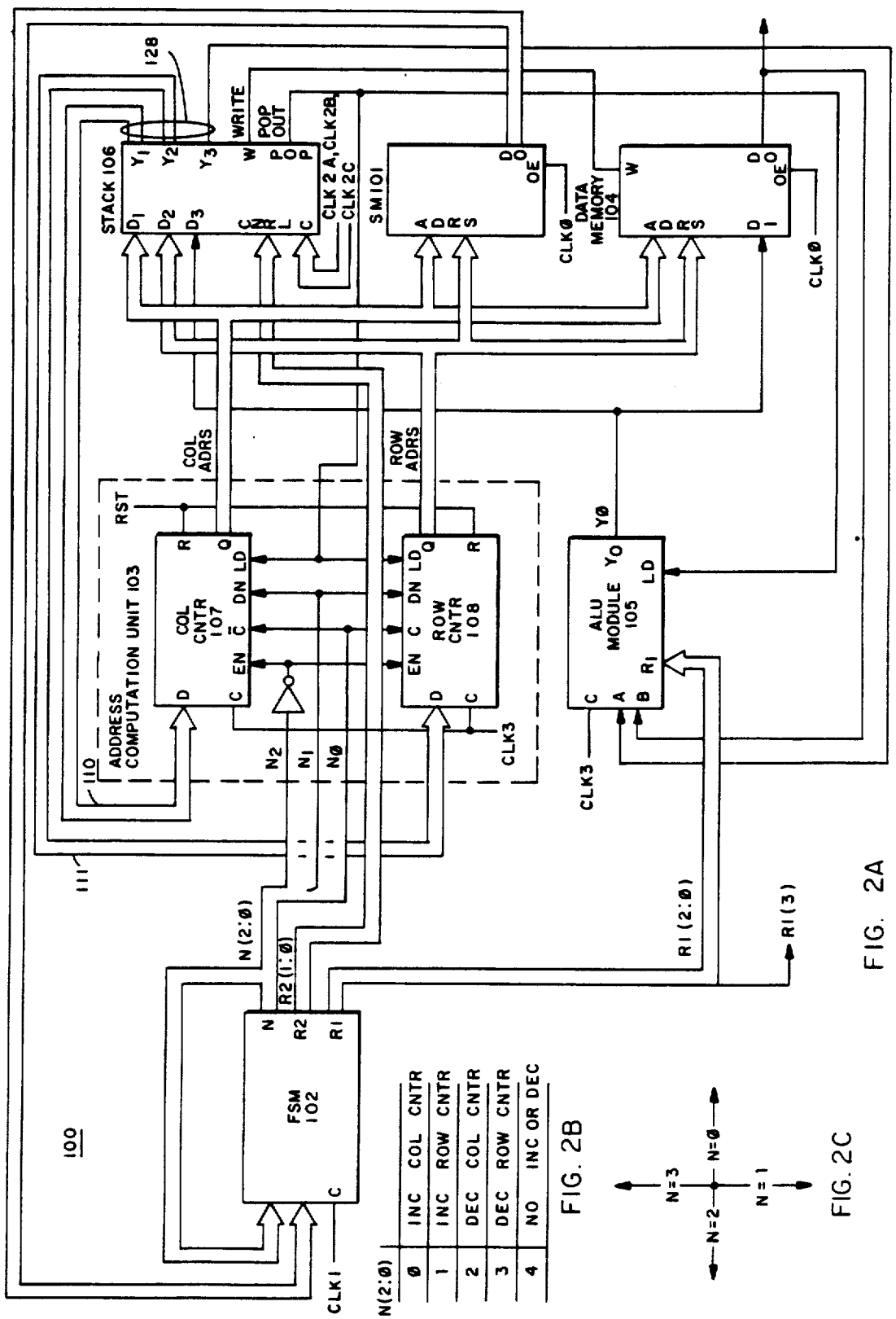

| RI (2:0) | ALU FTN |
|---|---|
| 0 | $Y_0 \leftarrow Y$ |
| 1 | $Y_0 \leftarrow \overline{Y}$ |
| 2 | $Y_0 \leftarrow B$ |
| 3 | $Y_0 \leftarrow Y \cdot B$ |
| 4 | $Y_0 \leftarrow Y \cdot \overline{B}$ |
| 5 | $Y_0 \leftarrow Y + B$ |
| 6 | $Y_0 \leftarrow Y + \overline{B}$ |
| 7 | $Y_0 \leftarrow Y \oplus B$ |

SYMBOL MEMORY

| | 0 | 1 | 2 | 3 | 4 | 5 | 6 | 7 | 8 |
|---|---|---|---|---|---|---|---|---|---|
| 0 | Z | | | | | | | | Z |
| 1 | X | A | C | H | A | Z | | | Z |
| 2 | X | D | B | H | B | Z | | | Z |
| 3 | Z | E | F | H | K | H | H | H | Y |
| 4 | X | A | A | C | V | Z | | | Z |
| 5 | X | B | D | B | E | A | A | C | Z |
| 6 | Z | V | E | F | H | B | D | B | Z |
| 7 | Z | V | | | | V | E | F | Y |
| 8 | Z | E | H | H | H | F | H | H | Y |
| 9 | G | | | | | | | | S |

FIG. 6C

DATA MEMORY

| | 0 | 1 | 2 | 3 | 4 | 5 | 6 | 7 | 8 |
|---|---|---|---|---|---|---|---|---|---|
| 0 | | | | | | | | | |
| 1 | 1 | | | | | | | | |
| 2 | 1 | (1) | (0) | | (1) | | | | |
| 3 | | | (0) | | | | | | (0) |
| 4 | 0 | | | | | | | | |
| 5 | 1 | (0) | (0) | (1) | | | | | |
| 6 | | | | | | (1) | (1) | | |
| 7 | | | | | | | (0) | (0) | (0) |
| 8 | | | | | | (0) | | | (1) |
| 9 | | | | | | | | | |

FIG. 6D

| ITER-ATION | CLK3 MEMORY ADDRESS | | SM DO CLK0 | DM DO CLK0 | CLK1 FSM | | | CLK2B, CLK2C STACK | | | | | | ALU OUT CLK3 | DM D1 CLK2A |
|---|---|---|---|---|---|---|---|---|---|---|---|---|---|---|---|
| | | | | | | | | TOP | | NO.2 | | NO.1 | | | |
| | C | R | | | R2 | R1 | N | ADRS | D | ADRS | D | ADRS | D | | |
| 1 | 0 | 0 | Z | X | 0 | 0 | 1 | | | | | | | X | |
| 2 | 0 | 1 | X | 1 | 1 | 2 | 0 | 0 1 | X | | | | | 1 | |
| 3 | 1 | 1 | A | X | 1 | 0 | 1 | 1 1 | 1 | 0 1 | X | | | 1 | |
| 4 | 1 | 2 | D | X | 2 | 0 | 0 | 0 1 | X | | | | | 1 | 1 |
| 5 | 2 | 1 | C | X | 1 | 1 | 1 | 2 1 | 1 | 0 1 | X | | | 0 | |
| 6 | 2 | 2 | B | X | 2 | 0 | 0 | 0 1 | X | | | | | 1 | 0 |
| 7 | 3 | 1 | H | X | 0 | 0 | 0 | 0 1 | X | | | | | 1 | |
| 8 | 4 | 1 | A | X | 1 | 0 | 1 | 4 1 | 1 | 0 1 | X | | | 1 | |
| 9 | 4 | 2 | B | X | 2 | 0 | 0 | 0 1 | X | | | | | 1 | 1 |
| 10 | 5 | 1 | Z | X | 3 | 0 | 4 | | | | | | | 1 | |
| 11 | 0 | 1 | X | 1 | 0 | 0 | 1 | | | | | | | 1 | |
| 12 | 0 | 2 | X | 1 | 1 | 2 | 0 | 0 2 | 1 | | | | | 1 | |
| 13 | 1 | 2 | D | 1 | 1 | 4 | 1 | 1 2 | 1 | 0 2 | 1 | | | 0 | |
| 14 | 1 | 3 | E | X | 0 | 0 | 0 | 1 2 | 1 | 0 2 | 1 | | | 0 | |
| 15 | 2 | 3 | F | X | 2 | 0 | 0 | 0 2 | 1 | | | | | 1 | 0 |
| 16 | 2 | 2 | B | 1 | 1 | 3 | 1 | 2 2 | 1 | 0 2 | 1 | | | 1 | |
| 17 | 2 | 3 | F | X | 0 | 5 | 0 | 2 2 | 1 | 0 2 | 1 | | | 1 | |
| 18 | 3 | 3 | H | X | 0 | 0 | 0 | 2 2 | 1 | 0 2 | 1 | | | 1 | |
| 19 | 4 | 3 | K | X | 0 | 0 | 0 | 2 2 | 1 | 0 2 | 1 | | | 1 | |

FIG. 6E-1

| ITERATION | CLK 3 MEMORY ADDRESS | | SM DO CLK0 | DM DO CLK0 | CLK 1 FSM | | | CLK 2B, CLK 2C STACK | | | | | | ALU OUT CLK 3 | DM DI CLK 2A |
|---|---|---|---|---|---|---|---|---|---|---|---|---|---|---|---|
| | | | | | | | | TOP | | NO.2 | | NO.3 | | | |
| | C | R | | | R2 | R1 | N | ADRS | D | ADRS | D | ADRS | D | | |
| 20 | 5 | 3 | H | X | 0 | 0 | 0 | 22 | 1 | 02 | 1 | | | 1 | |
| 21 | 6 | 3 | H | X | 0 | 0 | 0 | 22 | 1 | 02 | 1 | | | 1 | |
| 22 | 7 | 3 | H | X | 0 | 0 | 0 | 22 | 1 | 02 | 1 | | | 1 | |
| 23 | 8 | 3 | Y | X | 2 | 0 | 4 | 02 | 1 | | | | | 1 | 1 |
| 24 | 2 | 2 | B | X | 0 | 0 | 0 | 02 | 1 | | | | | 1 | |
| 25 | 3 | 2 | H | X | 0 | 0 | 0 | 02 | 1 | | | | | 1 | |
| 26 | 4 | 2 | B | 1 | 1 | 3 | 1 | 42 | 1 | 02 | 1 | | | 1 | |
| 27 | 4 | 3 | K | X | 0 | 0 | 1 | 42 | 1 | 02 | 1 | | | 1 | |
| 28 | 4 | 4 | V | X | 0 | 0 | 1 | 42 | 1 | 02 | 1 | | | 1 | |
| 29 | 4 | 5 | E | X | 0 | 0 | 0 | 42 | 1 | 02 | 1 | | | 1 | |
| 30 | 5 | 5 | A | X | 1 | 0 | 1 | 55 | 1 | 42 | 1 | 02 | 1 | 1 | |
| 31 | 5 | 6 | B | X | 2 | 0 | 0 | 42 | 1 | 02 | 1 | | | 1 | 1 |
| 32 | 6 | 5 | A | X | 1 | 0 | 1 | 65 | 1 | 42 | 1 | 02 | 1 | 1 | |
| 33 | 6 | 6 | D | X | 2 | 0 | 0 | 42 | 1 | 02 | 1 | | | 1 | 1 |
| 34 | 7 | 5 | C | X | 1 | 1 | 1 | 75 | 1 | 42 | 1 | 02 | 1 | 0 | |
| 35 | 7 | 6 | B | X | 2 | 0 | 0 | 42 | 1 | 02 | 1 | | | 1 | 0 |
| 36 | 8 | 5 | Z | X | 3 | 0 | 4 | 02 | 1 | | | | | 1 | |
| 37 | 4 | 2 | B | X | 0 | 0 | 0 | 02 | 1 | | | | | 1 | |
| 38 | 5 | 2 | Z | X | 3 | 0 | 4 | | | | | | | 1 | |

FIG. 6E-2

| ITER-ATION | CLK3 MEMORY ADDRESS | | SM DO CLK∅ | DM DO CLK∅ | CLK1 FSM | | | CLK 2B, CLK 2C STACK | | | | | | ALU OUT CLK 3 | DM DI CLK2A |
|---|---|---|---|---|---|---|---|---|---|---|---|---|---|---|---|
| | | | | | | | | TOP | | NO. 2 | | NO. 3 | | | |
| | C | R | | | $R_2$ | $R_1$ | N | ADRS | D | ADRS | D | ADRS | D | | |
| 39 | ∅ | 2 | X | 1 | ∅ | ∅ | 1 | | | | | | | 1 | |
| 40 | ∅ | 3 | Z | X | ∅ | ∅ | 1 | | | | | | | 1 | |
| 41 | ∅ | 4 | X | ∅ | 1 | 2 | ∅ | ∅4 | 1 | | | | | ∅ | |
| 42 | 1 | 4 | A | X | 1 | ∅ | 1 | 14 | ∅ | ∅4 | 1 | | | ∅ | |
| 43 | 1 | 5 | B | X | 2 | ∅ | ∅ | ∅4 | 1 | | | | | ∅ | ∅ |
| 44 | 2 | 4 | A | X | 1 | ∅ | 1 | 24 | ∅ | ∅4 | 1 | | | ∅ | |
| 45 | 2 | 5 | D | X | 2 | ∅ | ∅ | ∅4 | 1 | | | | | ∅ | ∅ |
| 46 | 3 | 4 | C | X | 1 | 1 | 1 | 34 | ∅ | ∅4 | 1 | | | 1 | |
| 47 | 3 | 5 | B | X | 2 | ∅ | ∅ | ∅4 | 1 | | | | | ∅ | 1 |
| 48 | 4 | 4 | V | X | 3 | ∅ | 4 | | | | | | | ∅ | |
| 49 | ∅ | 4 | X | ∅ | ∅ | ∅ | 1 | | | | | | | ∅ | |
| 50 | ∅ | 5 | X | 1 | 1 | 2 | ∅ | ∅5 | ∅ | | | | | 1 | |
| 51 | 1 | 5 | B | ∅ | 1 | 3 | 1 | 15 | 1 | ∅5 | ∅ | | | ∅ | |
| 52 | 1 | 6 | V | X | ∅ | ∅ | 1 | 15 | 1 | ∅5 | ∅ | | | ∅ | |
| 53 | 1 | 7 | V | X | ∅ | ∅ | 1 | 15 | 1 | ∅5 | ∅ | | | ∅ | |
| 54 | 1 | 8 | E | X | ∅ | ∅ | ∅ | 15 | 1 | ∅5 | ∅ | | | ∅ | |
| 55 | 2 | 8 | H | X | ∅ | ∅ | ∅ | 15 | 1 | ∅5 | ∅ | | | ∅ | |
| 56 | 3 | 8 | H | X | ∅ | ∅ | ∅ | 15 | 1 | ∅5 | ∅ | | | ∅ | |
| 57 | 4 | 8 | H | X | ∅ | ∅ | ∅ | 15 | 1 | ∅5 | ∅ | | | ∅ | |

FIG. 6E-3

| ITERATION | CLK 3 MEMORY ADDRESS | | SM DO CLK0 | DM DO CLK0 | CLK1 FSM | | | CLK 2B, CLK 2C STACK | | | | | | ALU OUT CLK 3 | DM DI CLK 2A |
|---|---|---|---|---|---|---|---|---|---|---|---|---|---|---|---|
| | | | | | | | | TOP | | #2 | | #3 | | | |
| | C | R | | | R2 | R1 | N | ADRS | D | ADRS | D | ADRS | D | | |
| 58 | 5 | 8 | F | X | 2 | 0 | 0 | 05 | 0 | | | | | 1 | 0 |
| 59 | 2 | 5 | D | 0 | 1 | 4 | 1 | 05 | 0 | | | | | 1 | |
| 60 | 2 | 6 | E | X | 0 | 0 | 0 | 25 | 1 | 05 | 0 | | | 1 | |
| 61 | 3 | 6 | F | X | 2 | 0 | 0 | 25 | 1 | 05 | 0 | | | 1 | 1 |
| 62 | 3 | 5 | B | 1 | 1 | 3 | 1 | 05 | 0 | | | | | 1 | |
| 63 | 3 | 6 | F | 1 | 0 | 5 | 0 | 35 | 1 | 05 | 0 | | | 1 | |
| 64 | 4 | 6 | H | X | 0 | 0 | 0 | 35 | 1 | 05 | 0 | | | 1 | |
| 65 | 5 | 6 | B | 1 | 1 | 3 | 1 | 56 | 1 | 35 | 1 | 05 | 0 | 1 | |
| 66 | 5 | 7 | V | X | 0 | 0 | 1 | 56 | 1 | 35 | 1 | 05 | 0 | 1 | |
| 67 | 5 | 8 | F | 0 | 0 | 5 | 0 | 56 | 1 | 35 | 1 | 05 | 0 | 1 | |
| 68 | 6 | 8 | H | X | 0 | 0 | 0 | 56 | 1 | 35 | 1 | 05 | 0 | 1 | |
| 69 | 7 | 8 | H | X | 0 | 0 | 0 | 56 | 1 | 35 | 1 | 05 | 0 | 1 | |
| 70 | 8 | 8 | Y | X | 2 | 0 | 4 | 35 | 1 | 05 | 0 | | | 1 | 1 |
| 71 | 5 | 6 | B | 1 | 0 | 0 | 0 | 35 | 1 | 05 | 0 | | | 1 | |
| 72 | 6 | 6 | D | 1 | 1 | 4 | 1 | 66 | 1 | 35 | 1 | 05 | 0 | 0 |
| 73 | 6 | 7 | E | X | 0 | 0 | 0 | 66 | 1 | 35 | 1 | 05 | 0 | 1 | 0 |
| 74 | 7 | 7 | F | X | 2 | 0 | 0 | 35 | 1 | 05 | 0 | | | 1 | 0 |
| 75 | 7 | 6 | B | 0 | 1 | 3 | 1 | 35 | 1 | 05 | 0 | | | 1 | |
| 76 | 7 | 7 | F | 0 | 0 | 5 | 0 | 76 | 1 | 35 | 1 | 05 | 0 | 0 | |

FIG. 6E-4

| ITER-ATION | CLK 3 MEMORY ADDRESS | | SM DO | DM DO | CLK 1 FSM | | | CLK 2B, CLK 2C STACK | | | | | | ALU OUT | DM PI |
|---|---|---|---|---|---|---|---|---|---|---|---|---|---|---|---|
| | | | | | | | | TOP | | #2 | | #3 | | | |
| | C | R | CLK 0 | CLK 0 | $R_2$ | $R_1$ | N | ADRS | D | ADRS | D | ADRS | D | CLK 3 | CLK 2A |
| 77 | 8 | 7 | Y | X | 2 | 0 | 4 | 35 | 1 | 05 | 0 | | | 1 | 0 |
| 78 | 7 | 6 | B | X | 0 | 0 | 0 | 35 | 1 | 05 | 0 | | | 1 | |
| 79 | 8 | 6 | Z | X | 3 | 0 | 4 | 05 | 0 | | | | | 1 | |
| 80 | 3 | 5 | B | 1 | 0 | 0 | 0 | 05 | 0 | | | | | 1 | |
| 81 | 4 | 5 | E | X | 3 | 0 | 4 | | | | | | | 0 | |
| 82 | 0 | 5 | X | 1 | 0 | 0 | 1 | | | | | | | 1 | |
| 83 | 0 | 6 | Z | X | 0 | 0 | 1 | | | | | | | | |
| 84 | 0 | 7 | Z | X | 0 | 0 | 1 | | | | | | | | |
| 85 | 0 | 8 | Z | X | 0 | 0 | 1 | | | | | | | | |
| 86 | 0 | 9 | G | X | 3 | 0 | 1 | | | | | | | | |
| 87 | 8 | 1 | Z | X | 0 | 0 | 1 | | | | | | | | |
| 88 | 8 | 2 | Z | X | 0 | 0 | 1 | | | | | | | | |
| 89 | 8 | 3 | Y | 0 | 0 | 8 | 1 | | | | | | | | |
| 90 | 8 | 4 | Z | X | 0 | 0 | 1 | | | | | | | | |
| 91 | 8 | 5 | Z | X | 0 | 0 | 1 | | | | | | | | |
| 92 | 8 | 6 | Z | X | 0 | 0 | 1 | | | | | | | | |
| 93 | 8 | 7 | Y | 0 | 0 | 8 | 1 | | | | | | | | |
| 94 | 8 | 8 | Y | 1 | 0 | 8 | 1 | | | | | | | | |
| 95 | 8 | 9 | S | X | 0 | 0 | 4 | | | | | | | | |

FIG. 6E-5

NETWORK SIMULATION SYSTEM

CROSS REFERENCE TO RELATED APPLICATION

This is a continuation-in-part of application Ser. No. 698,514, filed Feb. 4, 1985 now abandoned.

BACKGROUND OF THE INVENTION

1. Field of the Invention

The invention relates generally to the field of digital data processing systems and more specifically to digital systems for processing arithmetic and logical arrays in the form of networks, with each array element being a processing node. The invention is also useful in processing arrays in the form of trees from, for example, a "root" processing element to the various "branches" and "leaves" along all of the various paths interconnecting the processing elements.

2. Description of the Prior Art

Current data processing systems have the basic form of a single processor element and a single memory element, with some mechanism for loading data and programs into the memory and obtaining processed data from the memory. The processor iteratively retrieves program instructions from the memory, determines the locations of the data to be processed by each instruction, and obtains the data from the memory, and then operates on the data as required by the instruction. The processor then determines the location into which the processed data is to be stored in memory, and transmits the data for storage in that location. The processor repeats this sequence of steps until all of the instructions have been processed, and the results are then available to the user in the memory.

The processor in the above-described system typically retrieves instructions from sequential locations in memory, subject to branches or discontinuities in the program which may cause the processor to begin retrieving instructions from elsewhere in the memory. The processor includes a program counter, which contains the address of the next instruction to be processed. Subject to loading from the program in response to program branches, the contents of the program counter typically is merely incremented to point to the next instruction, after each instruction is retrieved from memory.

Such data processing systems often require complex programming. To model, for example, complex networks of processing elements or to process arrays or trees of processing elements often requires programs which, when written, appear to be nothing like the original networks or arrays on which the programs are based. This also requires significant programming ability by the scientists, engineers and mathematicians who are attempting to use the system.

SUMMARY OF THE INVENTION

The invention provides a new and improved data processing system that models networks and arrays of processing elements interconnected according to selected patterns, which reduces the amount of programming knowledge required of a user.

The new data processing system comprises a processor which controls a random access memory and which is controlled, in turn, by a finite state machine. The memory stores, in locations corresponding to relative locations in the array being processed, representations of the processing elements comprising the network array as inserted by an operator, as well as initial input data, also from the operator, and processed data.

The processor includes addressing and processing circuitry. The addressing circuitry transmits address signals to the memory which enable it to retrieve the processing element representations from the memory, along with associated data. The processing element representations are transmitted to the finite state machine, which generates control signals enabling the processor to process the associated data. The control signals also enable the memory to store the processed data and the processor to compute an address from which processing element representation is retrieved for subsequent processing.

The invention thus provides a processing system that is relatively easy to program, as it allows the individual processing elements and the interconnection of processing elements in a network or array to be considered and programmed separately. After the processing elements are selected and their characteristics programmed into the finite state machine, the network or array representation is loaded into the memory. Thus, if the network is changed, all that need be done is to change the network representation in the memory.

BRIEF DESCRIPTION OF THE DRAWINGS

The invention is pointed out with particularity in the appended claims. The advantages of the invention may be better understood by referring to the following description taken in conjunction with the accompanying drawings, in which:

FIGS. 2A is a detailed block diagram of a data processing system as depicted in FIG. 1 and FIGS. 2B, and 2C are a table and diagram, respectively, that are useful in understanding the operation of the system depicted in FIG. 2A.

DESCRIPTION OF THE PREFERRED EMBODIMENTS

Figure 1:
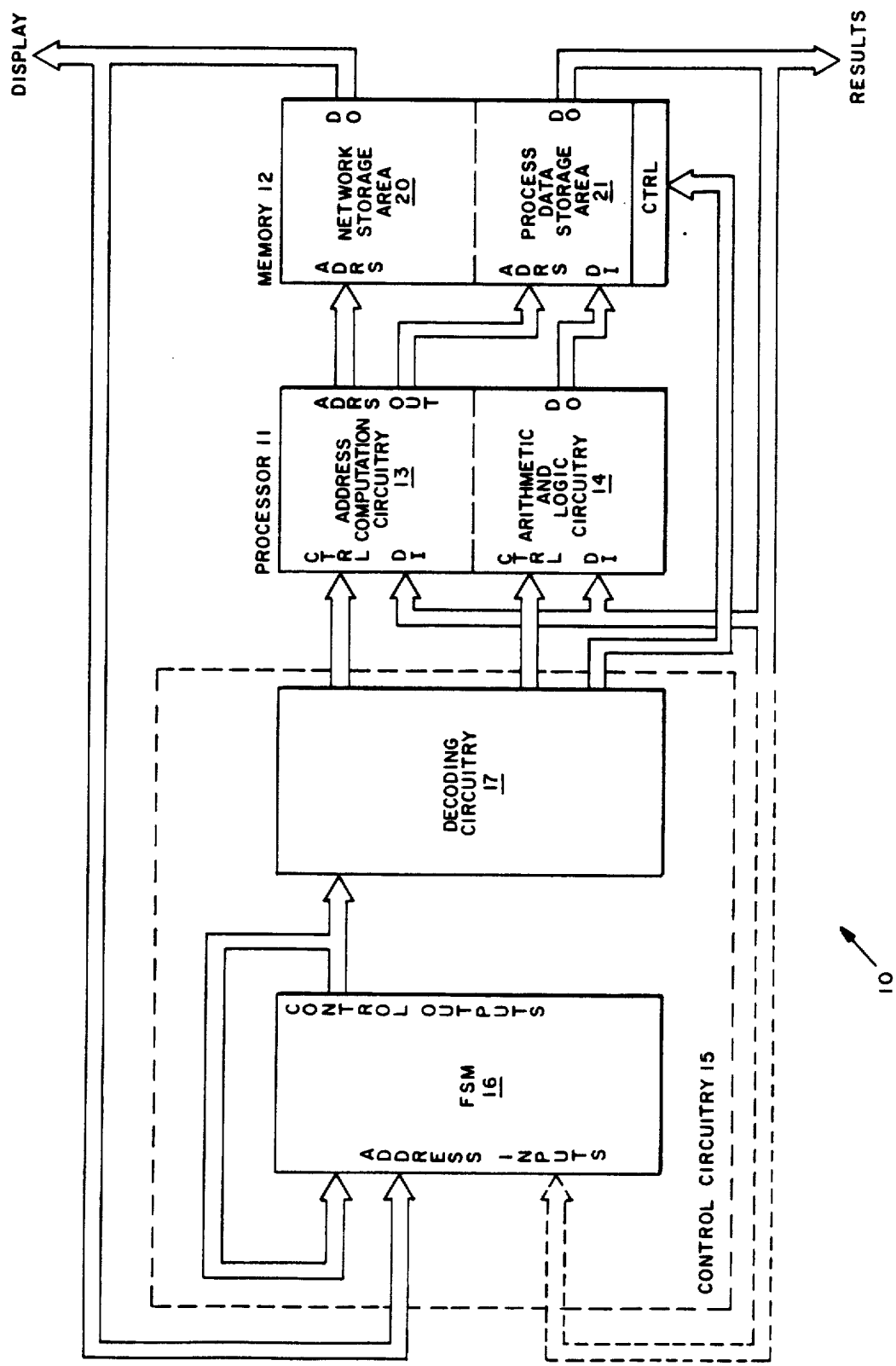
FIG. 1 is a general block diagram of a digital data processing system constructed in accordance with the invention.

FIG. 1 depicts a block diagram of a digital data processing system 10 including a processor 11 connected to a memory 12. The processor includes address computation circuitry 13 which computes addresses for identifying storage locations in memory 12 from which or into which information is retrieved or stored. Processor 11 also includes arithmetic and logic circuitry 14 which performs arithmetic and logical operations on data obtained from memory 12 and transmits data to the memory for storage.

System 10 further includes control circuitry 15, including a finite state machine 16 and decoding circuitry 17, which receives information from memory 12 and generates control signals which control processor 11 and memory 12.

System 10 processes programs in the form of arrays of interconnected processing elements. Each type of processing element is represented by a code or representation whose characteristics are stored in finite state machine 16. The finite state machine is a read-only memory having a plurality of addressable storage locations. Each block of locations stores the characteristics of one type of processing element.

Memory 12 is divided into a network storage area 20 and a process data storage area 21. The network storage area has a plurality of storage locations which are arranged in an array pattern corresponding to the pattern of the network of processing elements being processed. Specifically, each storage location in the network storage area is identified by row and column addresses which correspond to row and column locations of the processing elements in the networks.

The process data storage area 21 also includes storage locations defined by row and column addresses, and may also include other storage areas used for intermediate storage of process data and addresses. In one specific embodiment described in connection with FIGS. 2 through 6E-5, the intermediate storage areas provide storage to latch the output of the arithmetic and logic circuitry and also to store return information for branching purposes. Such information may be used, for example, with processing elements which have multiple output terminals; in processing such elements the system 10 first processes from one output terminal, then returns and begins processing from the other output terminal. The return information is used when the system returns to begin processing from the second output terminal of the processing element.

In operation, an operator stores the representations of the processing elements in the network storage area 20 of the memory 12, and initial data in corresponding locations in process data storage area 21. The characteristics of the processing elements are stored in the finite state machine 16 and the address computation circuitry is initialized. In sequential iterations, the contents of a storage location in network storage area 20, representing or identifying the processing element at the corresponding location in the network being processed, are retrieved and transmitted to inputs of finite state machine 16. The characteristics of the corresponding processing element are then transmitted by the finite state machine to the decoding circuitry 17. The decoding circuitry generates control signals which control the operation of address computation circuitry 13, arithmetic and logic circuitry 17 and memory 12 in response to the characteristics of the processing element which it received from the finite state machine 16. When the address computation circuitry calculates a new address, the process is repeated.

The finite state machine, in addition to being controlled by each processing element representation, is also controlled by its previous control output signals. At least a portion of the control output signals are coupled back to the input terminals of the finite state machine. The finite state machine may also be controlled by data outputs from the process data storage area 21.

A specific example of a data processing system as depicted in FIG. 1 is shown in FIG. 2. The system depicted in FIG. 2 will also serve to illustrate the operation and advantages of the invention.

The system 100 includes a symbol memory 101, a finite state machine 102 and an address computation unit 103. The symbol memory 101 includes a plurality of addressable storage locations, each storing the identification of one processing element of the network being processed. The processing elements comprising a network being processed are arranged in an array pattern having a selected number of columns and rows. The storage locations in the symbol memory 101 are similarly arranged in rows and columns, and each location stores the identification of the network element at the corresponding location in the network. Memory 101 may be a refresh memory for a display terminal and the network may thus be displayed for an operator.

The address computation unit 103 generates an address that identifies a location in the symbol memory 101 whose contents are transmitted to the finite state machine 102. In addition to transmitting addresses to the symbol memory 101, the address computation unit 103 also transmits an address to a process data memory 104. The process data memory stores, at each location, initial input data that correspond to input signals for the network under simulation, as well as certain process data that is generated by an arithmetic logic unit (ALU) module 105. The ALU module 105 includes arithmetic and logic circuitry, an intermediate storage register and control circuitry (see FIGS. 4A and 4B) and is also connected to the finite state machine 102 and to a data output (DO) terminal of process data memory 104, which supplies data to the ALU module.

A stack 106, including a multiple location memory 120 and control circuitry therefor (see FIGS. 3A and 3B) is provided to store intermediate data and addresses when a branch is encountered in a network. A branch occurs when the system encounters an element with outputs to two other processing elements, since the system may only process one element at a time. The address of the element at which a branch occurs, as well as process data from the ALU module 105, are stored on the top of the stack 106. When one path of the branch has been processed, the result is stored in process data memory 104, and the system returns to the processing element at which it last branched by retrieving, under control of the finite state machine 102, the data and address stored at the top of the stack. Along with a POP OUT signal generated by decoding circuitry associated with stack control signals from the finite state machine 102 (see FIG. 2B), the address is loaded in the address computation unit 103, which replaces the prior address with the address from the stack 106, and the data is coupled to an input terminal of ALU module 105.

The finite state machine 102 generates three sets of control signals. Control signals R1(2:0) enable the ALU module 105 to process the data from the process data memory 104 and stack 106 as required by the type of processing element being processed, and to generate one or more output words that are stored in the corresponding location in the stack or process data memory. Control signals R2(1:0) control the operations of stack 106, and control signals N(2:0) control address generation by address computation unit 103. Essentially, the N(2:0) control signals enable the address computation unit 103 to increment or decrement the row and/or column address signals to enable the system to step from processing element to processing element in the network. The combination of the N(2:0) control signals and the signals from symbol memory 101 together control the control signals transmitted by the finite state machine 102 for the next iteration and thus are coupled to the input terminals of the finite state machine.

The finite state machine 102 includes a read only memory which stores the program of operation of the system 100 and an output register (not shown) which is loaded in response to a CK1 timing signal. The specific program depends on the nature of the processing elements in the network. A specific example of such a program will be presented below in connection with FIGS. 6A through 6E-5. The output signals from the symbol memory 101 constitute high order address signals and the N(2:0) output signals from the finite state machine 102 constitute the low order address signals which together identify, during each iteration, a storage location in the finite state machine 102. Each location stores the necessary signals for forming the R2(1:0), R1(3:0) and N(2:0) control signals to control the system. The control signals are then decoded in decoding circuitry associated with each of the other elements of the system to further control those elements.

The address computation unit 103 includes a column counter 107 and a row counter 108 both of which receive the N(2:0) control signals. The N(0) control signal selectively enables one of the column or row counters 107 and 108. The N(1) control signal, when asserted, enables the counter which is enabled by the N(0) signal to count down or decrement in response to the CLK3 clocking signal, otherwise the enabled counter increments in response to the clocking signal. Finally, the N(2) control signal, when asserted, disables both counters 107 and 108 from incrementing or decrementing. These operations are summarized in the table in FIG. 2B. The network directions traversed are depicted in the direction rows in FIG. 2C. It will be appreciated that, with appropriate control signals, the row and column counters can be enabled to increment and/or decrement at the same time, thereby enabling movement from processing element to processing element along the diagonals.

As has been mentioned, the address computation unit 103 can be forced to return to an address at which a branch occurred by appropriate signals from stack 106. Decoding circuitry associated with the stack transmits the POP OUT signal which enables an LD "load" terminal on each of counters 107 and 108. Simultaneously, the stack transmits the row and column address signals onto lines 110 and 111. In response to the POP OUT signal, the counters receive and latch the corresponding address signals from the stack 106. The counters will thereafter increment or decrement from the address provided by the stack 106.

Figures 3A, 3B:
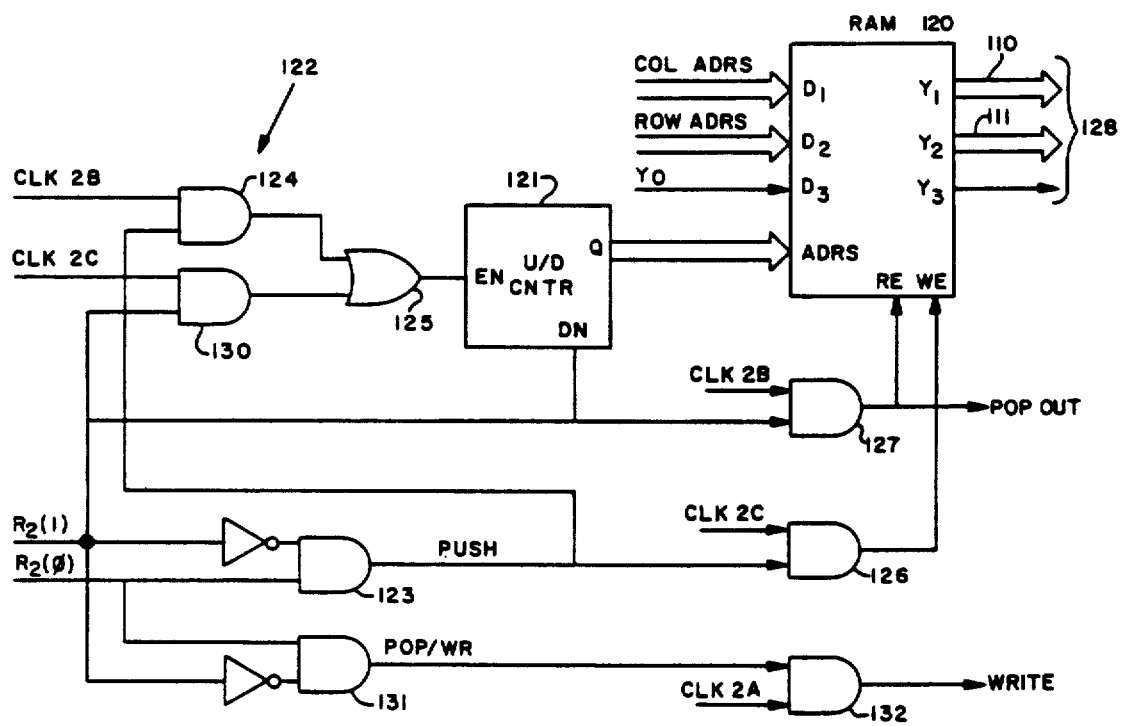
FIG. 3A is a circuit diagram of a stack, including storage circuitry and decoding and control circuitry therefor, which is useful in the data processing sytem of FIG. 2.
FIG. 3B is a table that is useful in understanding the operation of the circuitry depicted in FIG. 3A.

FIG. 3A depicts a circuit diagram of a stack 106 including a random access memory 120 which stores the column and row address and the state of the output data signal Y0 from ALU module 105 through input terminals D1, D2 and D3, respectively. In the system depicted in FIG. 2A, the stack has four locations, three for storing data and addresses from ALU module 105 and address computation unit 103, and the fourth, which is at the bottom of the stack, for storing a constant. The constant is used as shown below (see discussion below regarding FIG. 6E-5). The location in memory 120 which stores the input data, or from which data are retrieved, is selected by address signals from decoding circuitry comprising an up/down counter 121 controlled by a control network 122.

The network 122 receives binary-encoded R2(1:0) control signals which enable the stack 106 to function as shown in the table in FIG. 3B. If both of the R2(1:0) control signals are negated, which corresponds to the R2(1:0)=0 line in the table, the stack 106 performs no operation. However, if the R2(1) control signal is negated, and the R2(0) control signal is asserted, the stack 106 performs a PUSH operation as shown in the R2(1:0)=1 line in the table. An AND gate 123 (FIG. 3A) generates a PUSH signal which enables one input of an AND gate 124. When a CLK 2B timing signal is asserted, AND gate 124 is energized, which causes an OR gate 125 to enable the up/down counter 121 to increment. In response to a later CLK 2C timing signal, an AND gate 126 then enables memory 120 to store the address and data at the memory's D1, D2 and D3 data input terminals into the location identified by the up/down counter 121.

If, on the other hand, the R2(1) control signal is asserted, a POP operation is performed by the stack. This is shown in the R2(1:0)=2 and 3 lines in the table in FIG. 3B. The R2(1) control signal enables one input of AND gate 127, which enables the read enable input of memory 120 when the CLK 2B clocking signal is received. This in turn enables the memory 120 to couple the contents of the location then addressed by counter 121 to be transmitted on the output lines 128. The AND gate 127 simultaneously transmits the POP OUT signal to the address computation unit 103 and ALU module 105 of the system 100 (see FIG. 2A). In response to the next CLK 2C clocking signal, AND gate 130 enables counter 121 to decrement.

If the R2(1) control signal is asserted, and the R2(0) control signal is negated, as shown in the R2(1:0)=2 line in the table in FIG. 3B, the operation is a POP-AND-WRITE. Prior to the transmission of the contents of the location in memory 120 over lines 128, an AND gate 131 is energized to transmit a WRITE signal to data memory 104 (FIG. 2A). When the CLK 2A timing signal, which precedes the CLK 2B and CLK 2C timing signals, is received, an AND gate 132 transmits a WRITE signal to data memory 104 (FIG. 2A), enabling the data memory to store the Y0 data transmitted by the ALU module 105, at the location then specified by the address computation unit 103.

Figures 4A, 4B:
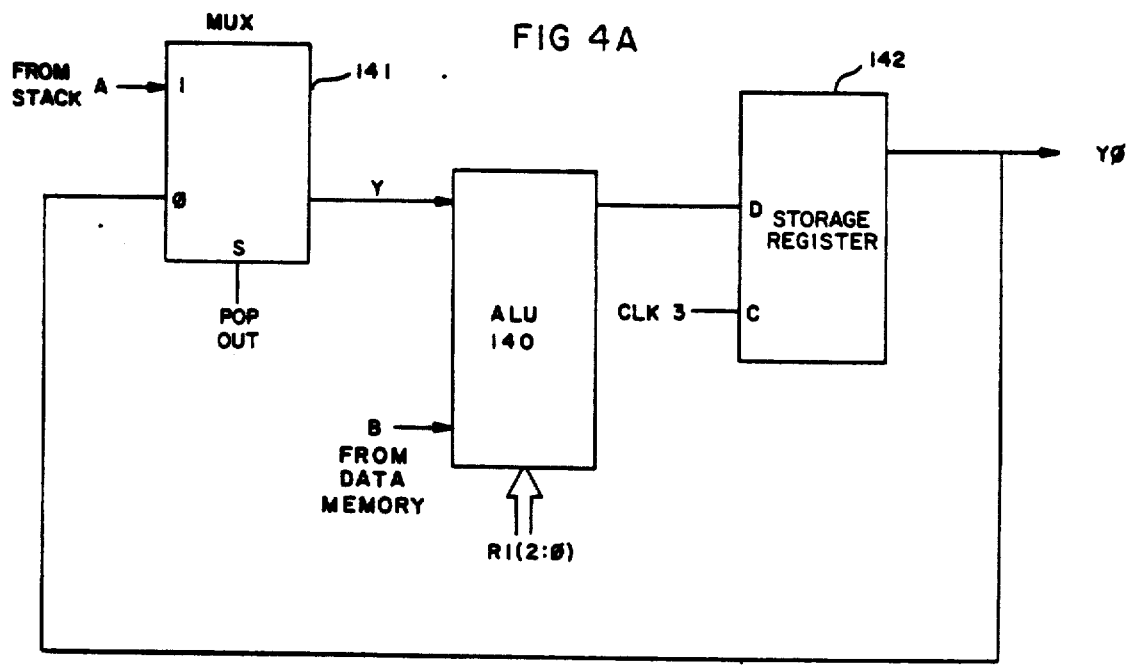
FIG. 4A is a circuit diagram of an arithmetic and logic unit module, including arithmetic and logic circuitry and storage circuitry, which is useful in the data processing system of FIG. 2.
FIG. 4B is a table that is useful in understanding the operation of the circuit depicted in FIG. 4A.

FIG. 4A is a circuit diagram of an ALU module 105 which is useful in the system 100 depicted in FIG. 2A, and FIG. 4B presents a table detailing the operations of the ALU module in response to each of the eight conditions of the low order R1(2:0) control signals from finite state machine 102. The high-order R1(3) control signal is used to enable an operator to read the contents of the locations of the data memory which correspond to the locations of output elements in the network, as explained below (see discussion regarding FIG. 6E-5). The ALU module 105 includes an arithmetic and logic unit (ALU) 140 which receives the R1(2:0) control signals and which actually performs the specified arithmetic and logic operations on two input signals designated Y and B. The B input signal is provided by the data memory 104, and the Y input signal is supplied by a multiplexer 141. The multiplexer 141, in turn, selectively couples either the A input signal from stack 106 or the ALU module's own Y0 output signal, which is stored in an intermediate storage register 142, to the ALU 140. The multiplexer is controlled by the POP OUT signal from the stack 106. If the R2(1:0) signals from finite state machine 102 enable the stack to transmit the POP OUT signal, the Y output signal from multiplexer 141 corresponds to the A input, which is supplied by the stack. Otherwise, the Y output signal from multiplexer 141 corresponds to the Y0 signal from flip-flop 142. The output of the ALU 140 is latched in flip-flop 142 in response to a CLK 3 clocking signal, which succeeds the CLK 2C timing signal.

The table in FIG. 4B details the eight operations performed by one specific embodiment of ALU 140 in response to the low-order R1(2:0) control signals. The R1(2:0) control signals are binary encoded to represent a numerical value between zero and seven with each value being represented by a line of the table. When R1(2:0)=0, the ALU 140 passes the Y signal to the D input of flip-flop 142 as shown in the first line of the table. If R1(2:0)=1, as shown in the second line of the table, the output of the ALU 140 is the complement of the Y input signal, which is coupled to flip-flop 142 for storage. If R1(2:0)=2 (third line), the ALU passes the B input from data memory 104 to flip-flop 142 for storage. If R1(2:0)=3 (fourth line), ALU 140 couples the logical AND of the Y and B inputs for storage in flip-flop 142, and if R1(2:0)=4 (fifth line), the B input is first complemented before the AND operation takes place. If R1(2:0)=5 (sixth line) or 6 (seventh line), an OR operation takes place on the Y and B inputs, with the B input being complemented if R1(2:0)=6. If R1(2:0)=7 (last line), an exclusive-OR operation takes place on the Y and B inputs.

Figure 5:
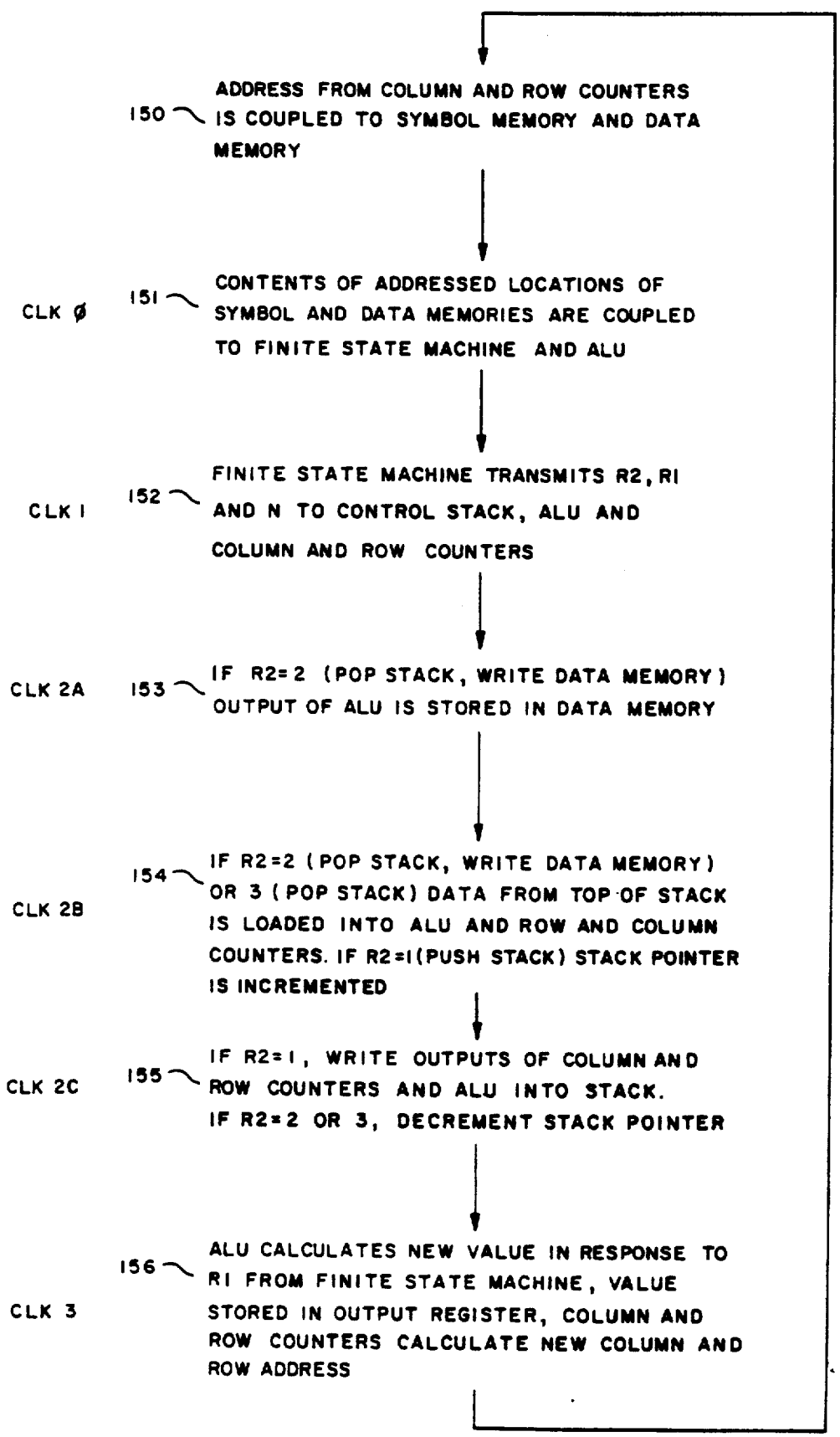
FIG. 5 is a flow diagram which is useful in understanding the operations of the data processing system of FIG. 2.

FIG. 5 constitutes a flow diagram depicting the operations of the system 100 depicted in FIG. 2A for each iteration, that is, for each sequence of CLK 0 through CLK 3 timing signals, and indicates the timing signals at which each operation occurs. The system performs all of the operations depicted in FIG. 5 for each processing element which it encounters. Initially, an address from address computation unit 103 is coupled to the address inputs of symbol memory 101 and data memory 104 (step 150). During a first iteration, this address may be a reset address or an address which is forced into the address computation unit in a known manner by circuitry which is not shown in FIG. 2A. In response to the CLK 0 timing signal the contents of the addressed location in symbol memory 101, which represents the type of network element at that location in the network, are coupled to the high-order address inputs of finite state machine 102 (step 151). Simultaneously, the contents of the addressed location in data memory 104 are coupled to the B input terminal of ALU module 105. The CLK 0 timing signal energizes an output enable terminal (OE) on each of memories 101 and 104.

In step 152, in response to the CLK 1 timing signal, which clocks the output register of the finite state machine, the finite state machine transmits the R2(1:0), R1(3:0) and N(2:0) control signals. The N(2:0) signals are coupled to control input terminals of the column and row counters 107 and 108 of address computation unit 103; however, the condition of these counters does not change until they receive the CLK 3 clocking signal as described below (step 156). Also in step 152, the low order R1(2:0) control signals are coupled to the control input terminals of ALU module 105. The high order R1 control signal, specifically the R1(3) control signal, enables the operator to obtain the output signals of the network under test from the data memory 104 as described below in connection with the example in FIGS. 6A through 6E-5. Finally, the two R2(1:0) control signals are coupled to the control input terminals of stack 106.

The sequential CLK 2A, CLK 2B and CLK 2C timing signals control all stack operations and indirectly control the storage of data produced by ALU module 105 in data memory and the data from stack 106 in address computation unit 103 and ALU module 105. In response to the CLK 2A timing signal, if the binary-encoded R2(1:0)=2, the Y0 output of the ALU module 105 is stored in data memory 104 at the location identified by the address which is coupled to the address inputs of data memory 104 in step 150. It should be noted that the address in the data memory at which the data is stored is the address being transmitted by address computation unit 103 when the CLK timing signal of the stack are transmitted onto output lines 128. Simultaneously, the POP OUT control signal is transmitted. The POP OUT signal received at the LD load terminal on column row counters 107 and 108 then enables the address signals on lines 110 and 111 to be stored in the respective counters. The POP OUT signal received at the LD load control terminal of ALU module 105 enables the data signal from stack 106 to be received through the A input terminal of ALU module 105, and specifically through multiplexer 141 (FIG. 4A). In the next step (155), the CLK 2C timing signal enables the counter 121 to decrement to point to the storage location in memory 120, which now comprises the top of the stack.

Returning to step 154, if the R2(1) timing signal is negated and the R2(0) timing signal is asserted, that is, if binary encoded R2(1:0)=1, the operation is a PUSH operation and counter 121 is incremented to point to a vacant location in memory 120. During step 155, in response to the CLK 2C timing signal, the column and row address from address computation unit 103 and the Y0 output from ALU module 105 are written into the memory 120 at the location identified by counter 121, which location now constitutes the top of the stack 106.

In response to the CLK 3 timing signal (step 156) the ALU module 105 calculates and stores in register 142 (FIG. 4A) a new Y0 output signal. Depending on the conditions of the R1(2:0) control signals and the POP OUT signal, the new Y0 output signal may be based on the Y0 output signal from the previous iteration, the data popped by the stack in step 154 of this iteration, or data supplied by the data memory 104 in step 150 of this iteration. Simultaneously, the column and row counters 107 and 108 of address computation unit 103 are updated in response to the N(2:0) control signals. The counters are updated from their states as of step 154; accordingly, if the stack 106 was POPPED in step 154, the address which is updated in step 156 is the address provided by the stack, which was loaded in the address computation unit 103 during step 154. If the stack was not POPPED, the address which is updated is that which was provided by the address computation unit at the beginning of the iteration in step 150.

Following step 156, the system 100 returns to step 150 to begin a subsequent iteration.

The program of R2(1:0), R1(3:0) and N(2:0) control signals transmitted by finite state machine 102 during each iteration depends on the nature of the processing network and the logical operations, inputs and outputs represented by the symbols used to represent the circuit elements of the network stored in the symbol memory. Such networks may include, for example, problems represented by well-known Wallace trees, where the nodes represent processing elements and the lines interconnecting the nodes represent the network paths traversed through the trees. The networks may also include n-order recursive or non-recursive digital filters where the processing elements represent multiplications and additions in well-known filter algorithms. As one specific example, the operation of the system 100 will be illustrated in connection with a simulation of a network of electronic circuit elements depicted in FIG. 6A.

Figures 6A, 6B:
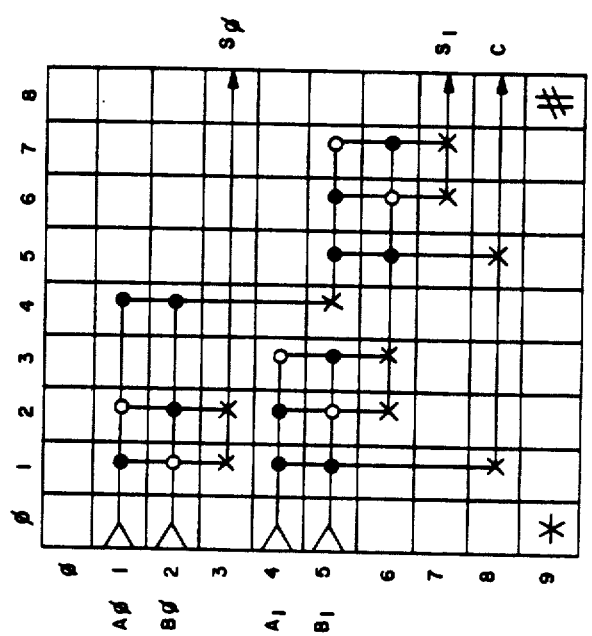
FIGS. 6A through, 6B, 6C, 6D, 6E-1, 6E-2, 6E-3, 6E-4, 6E-5 are diagrams which present an example illustrating the operation of the data processing system of FIGS. 2-5.

FIG. 6A depicts a circuit diagram of a two bit adder having low order inputs A0 and B0, high order inputs A1 and B1, a low order output S0, a high order output S1, and a carry output C. The symbols used in FIG. 6A to represent the network elements are conventionally used in the layout and design of circuits in VLSI (very large scale integration) circuits. Fourteen different symbols are used in the circuit depicted in FIG. 6A, each comprising a processing element for system 100, and representing a type of circuit element as defined in a table in FIG. 6B. Each type of circuit element is associated with a letter symbol which is stored in the locations in symbol memory 101 corresponding to the locations in the network at which the elements are connected. The contents of the symbol memory are depicted in FIG. 6C.

In simulating the operation of the circuit depicted in FIG. 6A, the data processing system 100 will begin at the inputs at the left and proceed to the right and downward. As shown by the direction rose of FIG. 2C, these directions are represented by N(2:0)=0 or 1. In addition, in some cases N(2:0)=4 may be encountered, which prevents the address computation unit 103 from changing state. For the simulation of the circuit of FIG. 6A, the system does not need to use the left and up directions, that is, directions represented by N(2:0)=2 and 3, since, for all of the processing elements, inputs are from the left and up, and outputs are to the right and down as shown in FIG. 6B.

Entries for R2, R1 and N (that is, the N for the next iteration), which are stored in the read-only memory of the finite state machine 103 (FIG. 4), are shown in FIG. 6B for N(2:0)=0, 1, and 4. However, no entries are shown for N(2:0)=2 or 3. (corresponding to the left and up directions), since these will not be encountered by system 100 in simulating the circuit depicted in FIG. 6A. It will be appreciated, however, that processing elements may be defined and used in connection with a simulation which will enable the system to step upwardly and/or to the left. As a result of the selection of the processing elements used in the example depicted in FIGS. 6A through 6E-5, the system will not, however, step in directions other than to the right and down.

A dash in a particular entry in the table on FIG. 6B indicates that that entry will not be encountered for the circuit of FIG. 6A, for the particular value of "N". Thus, if N(2:0)=1 during an interation, the "A" network element, shown in the first line in FIG. 6B, will not be encountered in the next iteration.

As has been mentioned, fourteen different symbols are used to represent the circuit elements the circuit in FIG. 6A, each represented by a letter. The definitions and characteristics of the circuit elements represented by the symbols are as follows:

(1) For the circuit element represented by the letter "A", the input to the element is from the left, and the outputs are to the right and down. In the circuit element represented by the symbol, the signal transmitted by both outputs is the same as the signal received at the input.

(2) For the circuit element represented by the letter "B", the input signals are received from the left and above. The output signal to the right is the same as the input signal from the left. The output signal down is the logical AND of the input signals.

(3) For the circuit element represented by the letter "C", the signal coupled over the output signal over the line down is the complement or inverse of the input signal received from the left. The output signal to the right is the same as the input signal from the left line.

(4) For the circuit element represented by the letter "D", the output signal over the line down is the logical OR of the input signal from the left line and the complement of the input signal from above. The output signal to the right is the same as the input from the left.

(5) For the circuit element represented by the letter "E", the output signal to the right is the same as the input signal from above.

(6) For the element represented by the letter "F", the output signal to the right is the logical OR of the input signals from the left and above.

(7) The letters "X" and "Y" represent input and output terminal elements respectively. The letters "G" and "S" are used to indicate the lower left and right corners of the array on which the circuit is drawn. The letter "Z" indicates that there is no circuit element at that location in the network.

(8) The "H" and "V" symbols represent horizontal and vertical network lines respectively, and the "K" symbol indicates a location in the circuit where horizontal and vertical lines cross, with no logical operation or interconnection between the lines or signals at the point where they cross. The output signals to the right and down are the same as the input signals from the left and above, respectively.

FIG. 6C is a memory map showing the contents of the symbol memory 101 during the simulation of the circuit depicted in FIG. 6A. Each letter corresponds to a circuit element and is keyed to the table of FIG. 6B. In addition to the letters representing the circuit elements and the G and S letter symbols, an operator also must insert Z letter symbols in the left- and right-hand columns where other elements do not appear and also at the right-hand ends of rows of circuit elements which do not extend to the right-most column of the array, so as to indicate the end of the row of circuit elements.

FIG. 6D is a memory map showing the data which is initially stored in the data memory 104 (FIG. 2A) by an operator as input signals or data, as well as data stored there by system 100 during a simulation in response to the input data. The data which are not enclosed by parentheses represents the conditions of the input signals at the input terminals to the network, which are stored in the memory 104 by an operator as initial input data, and data enclosed by parentheses represents data, and specifically the condition of the output signal Y0 from ALU module 105, deposited in data memory 104 by the system during the simulation.

The operations of system 100 programmed to simulate the circuit depicted in FIG. 6A will be described in connection with FIGS. 6E-1 through 6E-5. The initial input signals are the numbers not in parenthesis shown in the data memory map of FIG. 6D. The contents of the symbol memory are shown in FIG. 6C. The finite state machine is programmed as shown in FIG. 6B.

First, the detailed operations of the system will be described at each of the timing signals during each iteration, for the first several iterations, to illustrate the operation of the various components of the system as outlined in FIG. 5. Then a general description of the operations performed at several iterations will be presented to illustrate the programming of the system for the simulation of an electronic circuit network.

The initial value of the N(2:0) control signals is "4". How this was obtained will be shown below in connection with iteration 95 on FIG. 6E-5. In the first iteration, and with reference also to FIG. 5, the memory address transmitted by address computation unit 103 is the reset address (0,0), where the first digit is the column address (the "C" column in FIGS. 6E-1 through 6E-5) transmitted by column counter 107, and the second digit is the row address ("R" column in FIGS. 6E-1 through 6E-5) transmitted by row counter 108. In response to the CLK 0 timing signal (FIG. 5, step 151) the symbol memory (the "SM DO" symbol memory data out column in FIGS. 6E-1 through 6E-5) transmits to finite state machine 102 signals which represent the symbol "Z", which is stored in the storage location of the symbol memory having address (00) as shown in FIG. 6C. The output signal from the data memory ("DM DO" data memory data out column) is irrelevant at this point, as shown by the letter "X".

In response to the CLK 1 timing signal, the finite state machine transmits the control signals [R2(1:0)=0, R1(3:0)=0, N(2:0)=1], which corresponds to the value stored in the finite state machine for the Z element and N=4 (as shown in the table in FIG. 6B). The stack is empty at the beginning of this iteration (except for a constant as explained below in connection with the eighty-sixth iteration on FIG. 6E-5), and because the stack control signals R2(1:0)=0, no stack operation occurs during this iteration (FIG. 5, steps 154, 155). The ALU module's Y0 output signal during this iteration is also irrelevant as indicated by the "X" in the ALU OUT column. Furthermore, no data is loaded into the data memory 104 (FIG. 5, step 153) during this iteration, as shown by the "DM DI" (data memory data in column an FIG. 6E-1). Because control signals N(1:0)=1 during the first iteration, the row counter 108 is incremented (see FIG. 2B) in response to the CLK 3 timing signal (FIG. 5, step 156). This is the end of the first iteration.

During the second iteration (see the entries for the second iteration in the second line of FIG. 6E-1) the CLK 0 timing signal enables the symbol memory 101 (FIG. 4) to transmit the contents of the (0,1) location, which correspond to signals representing the "X" (input terminal) circuit element to the finite state machine, and the data memory 104 to transmit the input signal, which is stored at the (0,1) location therein, to the B input of ALU module 105 (FIGS. 2A and 4A). In response to the CLK 1 timing signal, the finite state machine then transmits the control signals [R2(1:0)=1, R1(3:0)=2, N(2:0)=0], which are contained in the N=1 entry in FIG. 6B for the "X" element. It should be noted that N(1:0)=1 was the condition of the N(1:0) control signals at the end of the previous iteration. Since the R2(1:0) stack control signals have the binary-encoded value "1", a PUSH operation is enabled, which occurs in response to the CLK 2B and CLK 2C timing signals. The address signals (0,1) from the address computation unit, which are coupled to the D1 and D2 inputs, respectively, of the stack 106 (see FIGS. 2A and 3A) are pushed onto top of the stack. This address is used as shown below.

Continuing with the second iteration, the ALU module 105 receives initial signal "1", which is the input signal from the data memory 104 at the B input terminal. Since the R1(2:0) control signals have the binary-encoded value "2", the ALU 140 (FIG. 4A) passes the input signal at the B input terminal (see FIG. 4B) to the D data input of flip-flop 142. In response to the CLK 3 timing signal, this signal is latched in flip-flop 142 and, as shown in the ALU OUT column in FIG. 6E-1, the Y0 output signal has the value "1". Also in response to the CLK 3 timing signal, since control signals N(2:0)=0, the column counter is incremented (FIG. 2B). Thus, the address provided by address computation unit 103 for the third iteration is (C=1, R=1). This is the end of the second iteration.

For the third iteration, the contents of the (1,1) storage location in the symbol memory correspond to the "A" circuit element. These contents are transmitted to the finite state machine. In response to the CLK 1 timing signal, finite state machine 102 transmits control signals R2(1:0)=1, R1(3:0)=0, N(2:0)=1] which are shown in the N=0 entry for the "A" circuit element as depicted in the table in FIG. 6B. Since the control signals R2(1:0)=1, the stack operation again is a PUSH operation. In response to the CLK 2B timing signal, the counter 121 in the stack 106 is incremented to point to a storage location in memory 120 which represents the new top of the stack. The (1,1) address and the Y0=1 output signal from ALU module 105 (which, it should be noted, was initially generated in response to the CLK 3 timing signal of the previous, or second, iteration) is then stored in the location identified by couner 21 in response to the CLK 2C timing signal. In response to the CLK 3 timing signal, the outputs of the ALU module 105 and address computation unit 103 are updated. Since the control signals R1(3:0)=0, and the POP OUT signal provided by stack 106 is negated, ALU module 105 couples the Y0=1 output signal generated during the previous iteration for storage in register 142 of ALU module 105. Thus, the output of ALU module 105 is unchanged from the previous iteration. However, since the address control signals N(2:0)=1, the row counter is incremented (FIG. 2B), and the new address to be used during the fourth iteration is (1,2) as shown in the corresponding columns of the fourth iteration.

In the fourth iteration, the circuit element at the (1,2) location in the network (see FIG. 6A) corresponds to the letter "C" and the control signals provided by the finite state machine 102 are [R2(1:0)=2, R1(3:0)=0, N(2:0)=0]. Since the control signals R2(1:0)=2, a POP-AND-WRITE stack operation is enabled. In response to the CLK 2A timing signal (FIG. 5, step 153), the Y0 output signal, which is a "one", from ALU module 105 is deposited and stored in the location in data memory 104 specified by the address provided by address computation unit 103. This storage is depicted in FIG. 6D, the memory map of data memory 104, and specifically at location (1,2), which shows the "one" enclosed by parentheses. In response to the CLK 2B timing signal, the contents of the location identified by counter 121 are coupled onto lines 128, that is, the top of the stack is popped. The address portion is loaded into the address computation unit and the data portion is transmitted to the ALU module 105, accompanied by the POP OUT signal. Thus, the counters of the address computation unit contain the values (C=1, R=1). In response to the CLK 2C timing signal, the stack's address counter 121 decrements and points to the stack location representing the new "top of the stack" (FIG. 5, step 155). Then, in response to the CLK 3 timing signal, the following occurs: (a) since the control signals R1(3:0) =0, and since the POP OUT signal is asserted, the ALU module 105 passes the input signal from the stack for storage in output register 142 (FIG. 4B), and (b) since control signals N(2:0)=0 the column counter 107 increments so that the address for the fifth iteration is (2,1), as shown in the respective columns of FIG. 6E-1 for the fifth iteration.

The same procedure is repeated for the succeeding iterations. In the eighty-sixth iteration, the constant stored in the stack is used as follows. In that iteration the network element corresponds to the "G" element (FIG. 6B), which is provided by the operator to define the lower left-hand corner of the network (FIG. 6A). At that time, the stack is empty of all data deposited therein during the simulation by the system; the only data present in the stack is the constant value mentioned above. The constant represents the address of the upper right-hand corner of the array (C=8, R=0), which is popped in the eighty-sixth iteration, and loaded into the address computation unit. Since control signals N(1:0)=1 during that iteration, the row counter is incremented, and the address for the eighty-seventh iteration is (8,1), which is one row down from the upper right-hand corner. The system then steps down the right-hand side of the network in succeeding iterations.

In the eighty-ninth, ninety-third and ninety-fourth iterations, the control signals R1(3:0)=8, that is, the R1(3) control signal is asserted. In this condition, the contents of the data memory at the indicated locations are transmitted to the operator. These contents, which are depicted in the right-hand column of the memory map shown in FIG. 6D, represent the simulated responses of the circuit network to the values of the inputs in the left-hand column of the same memory map, as determined by system 100. These responses were deposited in the data memory in iterations 23, 70 and 77 (FIGS. 6E-2, 6E-4 and 6E-5, respectively).

Finally, in the ninety-fifth iteration, the "S" element is processed. In response to the "S" element (FIG. 6B), the control signals N(2:0)=4, which is the initial condition for the control signals at the beginning of a simulation, as noted above in the discussion concerning the first iteration. An operator may deposit new values representing network input signals in the data memory 104 if another simulation is desired.

With this background, the programming of the system will be generally described with reference to FIGS. 6E-1 through 6E-5. The various values representing the R2(1:0), R1(3:0) and N(2:0) control signals in the table shown in FIG. 6B are selected so that the system will operate according to the desired program of operation. The first iteration is an initialization operation to place the system 100 in a selected condition before the system processes the network circuit elements. It is thus desirable to provide a "Z" element in the upper left-hand corner as the first element encountered during the simulation, which places the system in the selected condition.

In the second iteration, the input terminal represented by the letter "X" causes the system to push the network address (0,1) of the element onto the stack. This is used for return information; as shown below (iteration 11) when the system has proceeded as far as it can in the simulation using the input data at this input terminal element, it will return to this input terminal element and step down the left side of the network to the next input terminal element. The output of the ALU module 105 at the end of this iteration corresponds to the value of the input data for the input terminal element, which was received from the data memory.

In the third iteration, the system processes the network element at location (1,1), which has the symbol "A". This element causes a branch, as the element's outputs go both to the right and down. Here, the system pushes the address and ALU module's output onto the stack, to be retrieved after it has completed the first leg of the branch (iteration 5). The first branch leg which is taken by the system is the downward leg. The contents of register 142 in ALU module 105 correspond to the output of the A element in the downward direction, which, it should be noted, is the same as the input signal to the element from the left (see FIG. 6B).

In the fourth iteration, the system processes the element at location (1,2), which has the symbol "D" and which is the first element in the first branch from the "A" element in location (1,1). This D element also requires an input from the left, which is stored in the data memory 104, but which is not now available to the ALU module 105. Thus, the system is programmed to enable the stack to perform a POP AND WRITE operation [thus, R2(1:0)=2] to store the value of the input data from the element above [that is, the A element at location (1,1)] in the data memory 104, at the location corresponding to the location of the circuit element in the symbol array. This stored data is used during the thirteenth iteration, when the second input data will be available to the ALU module 105. The stack operation in this iteration also causes the system to pop the top of the stack 106 and sequence to the second leg of the branch from the A element processed in the third iteration.

Returning to the third iteration, it should be noted that the system 100 first proceeded along the downward leg of the branch, with the rightward leg of the branch being taken second. In the definitions of the circuit elements in FIG. 6B used in the network of FIG. 6A at which branches can occur, namely those elements which have two output directions, it will be appreciated that the output signals to the right are the same as the input signals from the left; accordingly, the input signals to the branching elements from the left can be used directly by the elements in the second leg of the branch without having to be processed through the ALU module 105. Thus, when the system returns to begin the second, rightward, leg of the branch, the system can immediately step to the first element in the second leg, namely, the first element to the right of the element at which the branch occurred, without first returning to the element at which the branch occurred. This is illustrated in interation five.

Thus, in iteration five, the system, on returning from the downward leg of the branch from the circuit element at location (1,1), steps directly to the circuit element at location (2,1). Since this element, which has the symbol "C", also has outputs both to the right and down, a branch again occurs. The system again first takes the downward leg, and pushes the data and address onto the stack as return information. Since the downward output signal of this element is the complement of the input signal (see FIG. 6B), the output of the ALU module is the complement of the input signal of the circuit element, which was loaded into the ALU module's register 142 when the stack 106 popped during the fourth iteration.

For the sixth iteration, the system steps to the element at location (2,2) which, like the element processed in the fourth iteration, requires a second input (from the left). Thus, the system deposits the (above) input value in the data memory 104, at the location corresponding to this element, for use during iteration 16. The return information is popped and the address stored in the address computation unit 103 and the data returned to the ALU module 105. The address computation unit is enabled to step to location (3,1) for the seventh iteration.

In the seventh iteration, the system steps across the horizontal conductor at location (3,1), with the finite state machine enabling the column counter 107 (FIG. 2A) to increment. In the eighth and ninth iterations, the system performs the same operations as in the third and fourth iterations. It should be noted that the element encountered in the eighth iteration, which is represented by the letter "A", is the same type of element as is encountered in the third iteration. The system uses the "Z" symbol which is encountered in the tenth iteration to indicate the end of the row. The fact that there is no circuit element to the right of the rightmost "A" element in the row has no effect on its operation or the operation of the system in response thereto.

In the tenth iteration, the system takes the branch to the right from the "A" circuit element at location (4,1), and encounters the blank element represented by the symbol "Z". This element enables the system to pop the stack and write the contents in the address computation unit 103 and ALU module 105. This returns the system to the input terminal element at location (0,1), as shown in the eleventh iteration. In the eleventh iteration, since control signals N(2:0)=1 (instead of "0" as in the second iteration, when the input element was first processed), the address computation unit steps to location (0,2), where it processes the next input element. The value of the second input provided by the operator, a "one", which is stored in location (0,2) of the data memory 104, is coupled to the ALU module 105, and stored in its register 142.

During the next several iterations, the system uses the second input value. In the thirteenth iteration, the system again processes the element at location (1,2) having the symbol "D". This time, the system has the second input value in the ALU module 105. The input value provided by the element at location (1,1), which was stored in the data memory location (1,2) in the fourth iteration, is now retrieved and coupled to the B input of ALU module 105. The ALU module 105 then performs a logical operation on these inputs, and loads the result in its output flip-flop 142 (FIG. 7A).

A branch also occurs at the "D" element at location (1,2). Thus, before the ALU module stores the result of the logical operation in register 142, the system stores the return information in the stack. Thus, the value of the second input data, which is the same as the initial data provided by the second input, and the return address (1,2) are stored on the stack as return information. Note that, as shown in FIG. 5, the stack operation (steps 153, 154, 155) occurs before the ALU module operations (step 156) and so the input value which is stored in the stack for use in the second leg of the branch is the same as the input, from the left, which was provided to the "D" element where the branch occurred.

In the fourteenth iteration, the system processes the element at location (1,3), which is represented by the letter "E". This element has only one input (from above) and one output (to the right) and performs no logical operation, so the system cycles to iteration fifteen. In the fifteenth iteration, the system steps to the element which receives the output of the "E" element, that is the "F" element at location (2,3). This element requires an additional input value from the element at location (2,2), and so the system stores the input value from the element at location (1,3) in data memory 104, at the location (2,3). This data will be used in the seventeenth iteration. The system also pops the stack to return to the second leg of the branch which occurred in the thirteenth iteration.

In the sixteenth iteration, the system steps to the second leg of the branch that occurred in the thirteenth iteration, and processes the "B" element at location (2,2). In this condition, the input value from the "C" element at location (2,1), which was stored in data memory 104 in the sixth iteration, is coupled as the B input to ALU module 105. The second input value from the "X" input element at location (0,1), is already stored in the register 142 in the ALU module, as a result of the stack operation in the fourteenth iteration. The ALU module performs the logical operation required by the "B" element at location (2,2) and stores the output in flip-flop 142.

A branch also occurs in the sixteenth iteration, since the "B" element has outputs both to the right and down. Thus, prior to the ALU operation, return information, including the value of the input to the "B" element from the left and the address of the element, are pushed onto the stack.

In the seventeenth iteration, the system returns to the "F" circuit element at location (2,3). The left input to this element is stored in the (2,3) location in the data memory, having been stored there in the fifteenth iteration. The input from above was stored in register 142 of ALU module 105 in the sixteenth iteration. During this iteration, the data stored in the (2,3) location in the data memory is coupled to the B input of the ALU module, and the contents of register 142 are coupled to the Y input of ALU 140. The ALU performs the logical operation required by the finite state machine in response to the F circuit element. The result of the logical operation performed by the ALU module is then stored in flip-flop 142.

In iterations eighteen through twenty-two, the system steps across the horizontal path from the "F" element at location (2,3) to output terminal element "Y" in location (8,3), which is processed in the twenty-third iteration. In response to the "Y" element, the system performs a pop-and-write stack operation, which enables the output of the ALU module 105 to be written into the data memory 104 at location (8,3). The return information is then popped to enable the system to return to the second leg of the branch which occurred at the "B" element in location (2,2) in the sixteenth iteration. It should be noted that the output value from ALU module 105 which was stored in the data memory at location (8,3) was the same as the output value of the "F" circuit element at location (2,3).

The programming of the system to perform iterations twenty-four through eighty-two will not be described in detail; from the above discussion, the programming will be apparent to those skilled in the art. After data is stored in the (8,8) storage location in data memory 104, which corresponds to the "C" (carry) output terminal, the system will return to the input element at location (0,5) in the eighty-second iteration. The system next steps down the left edge of the array, sequentially processing the "Z" elements in locations (0,6), (0,7) and (0,8). In the eighty-sixth iteration, the system processes the "G" element at location (0,9), which enables the system to pop the constant from the stack. The constant is selected to force the address computation unit 103 to sequence the system the upper right-hand corner of the array. In the remaining iterations, the simulation engine steps down the right edge of the array, and, when the "Y" output terminal elements are processed transmits the value stored in the data memory 104 during iteration twenty-three for location (8,3), thirty-six for location (8,5), and seventy for location (8,8), along with the R1(3) control signal. These values are transmitted during the eighty-ninth, ninety-third and ninety-fourth iterations.

Finally, in the ninety-fifth iteration, the system encounters the element having the symbol letter "S". This element marks the lower left-hand corner of the array, and is the last element processed during a simulation. The finite state machine transmits the control signals N(2:0)=4 to place the simulation in a reset state preparatory for another simulation.

From the foregoing, the selection of the binary encoding for the R2(1:0), R1(3:0) and N(2:0) control signals in FIG. 6B will be readily apparent to those skilled in the art. The particular binary encoding selected will depend on the nature of the network being simulated, which will, in turn, govern the network elements that are chosen to represent the network and their definitions, that is, the number of inputs to and outputs from each network element and the logical operations that the element performs on the signals which it receives from the various inputs to result in the signals transmitted over the outputs. The definitions of the circuit elements govern (a) when a branch is to occur and the return information that is to be pushed onto the stack, (b) when a second input is required and when it is available, and thus when data are written into or retrieved from the data memory and (c) on a return from branch, when the system is to proceed along the second leg of the branch, the location to which the system will return.

For example, in the example of FIGS. 6A through 6E-5, and with specific reference to circuit elements A, B, C, and D, it will be appreciated that the definitions of these elements requires that the output signals to the left be the same as the input signals from the right. Thus, when an element is processed at which a branch can occur, the return data is selected to be the signal received from the left, thus, the first leg of the branch is selected to be the downward leg. On the return, since the signal from the left, which has been stored as the return information, is the same signal which the branch element would transmit to the next element to the right, rather than returning to the branch element, the system can return to the first element along the second leg of the branch. Thus, on a return from branch, the N(2:0) control signals, which control the address calculation unit, enable the column counter to increment to start the simulation at the first element along the second leg of the branch. If, however, the branching element performs a logical operation on the signal which is passed to the second leg of the branch, the N(2:0) control signals would have to cause the address calculation unit to return to the branching element, and the R1(3:0) control signals would have to enable the ALU module 105 to perform the required logical operation before stepping to the second leg of the branch.

Furthermore, it will be appreciated that, since the address calculation unit 103 is under the control of the finite state machine 102, it can cause the system to step in any direction from one processing element to the next. Thus, the inputs to a processing element can be from any direction, and likewise the outputs from a processing element can be to any direction, which directions are controlled by the definitions of the processing elements.

The foregoing description is limited to a specific embodiment of this invention. It will be apparent, however, that this invention can be used, with appropriate modifications to the disclosed specific embodiments, in simulating diverse networks of defined types of network elements, and that the invention can be practiced in diverse systems than is described in the specification, and attain some or all of the advantages of the invention. Therefore, it is the object of the appended claims to cover all such variations and modifications as come within the true spirit and scope of the invention.

What is claimed as new and desired to be secured by Letters Patent of the United States is:

1. A data processing system for processing a network of processing elements each identified by a code representation, said data processing system comprising:

A. storage means comprising a plurality of addressable storage locations each identified by an address and each storing a code representation as well as process data for each of the processing elements, said storage means including address and process data input terminals, address and process data output terminals, network storage means including a plurality of storage locations for storing code representations of the processing elements and being connected to said address input terminal for receiving address signals for identifying the storage locations in the network storage means and said data output terminal for transmitting the code representation in the storage location identified by the address signals at the address input terminal, and process data storage means including a like plurality of storage locations to said plurality of storage locations in said network storage means for storing process data, said process data storage means being connected to said address input terminal, data input terminal and data output terminal and further including a control terminal for selectively receiving process data through said data input terminal for storage in the storage location identified by the address at said address input terminal or transmitting process data from the storage location identified by the address at said address input terminal through said data output terminal in response to a control signal from a finite state means received through said control terminal;

B. processing means including:
   i. address computation means connected to said address input terminals of said storage means for generating addresses to iteratively identify said storage locations in said storage means to permit said storage means to transit the code representations identified by said addresses; and ii. arithmetic and logic means connected to the data output terminal of said storage means for receiving and performing arithmetic and logical operations on the process data received from said storage means, said arithmetic and logic means being further connected to the data input terminal of said storage means for coupling data from the arithmetic and logical operations to said storage means for storage therein; and C. said finite state means connected to said processing means and said storage means for receiving the code representations from said storage means and for generating control signals coupled to said processing means and said storage means for controlling the operations of said storage means, said address computation means and said arithmetic and logic means in response to the received code representations for enabling iterative processing of the processing elements in the network.

2. A data processing system as defined in claim 1 in which said storage means further includes stack storage means including a plurality of addressable storage locations for storing address signals and process data, said addressable storage locations being connected to said address and process data input terminals and said process data output terminals and said address computer means includes means for generating address signals for identifying storage locations in said stack storage means in response to control signals from said finite state means, said finite state means further including means for generating storage control signals, received by said stack storage means, for controlling the storage of process data in and transmission of data from said stack storage means.

3. A data processing system as defined in claim 2 wherein said address computation means further includes address input terminal means connected to said process data output terminal and control terminal means connected to said finite state means for receiving address signals from said stack storage means in response to control signals therefor from said finite state means.

4. A data processing system as defined in claim 1 wherein said storage means further includes intermediate storage means connected to said address and process data input terminals and said process data output terminals for receiving and storing process data from said arithmetic and logic means.

* * * * *